US009745481B2

(12) United States Patent
Rolin et al.

(10) Patent No.: US 9,745,481 B2
(45) Date of Patent: Aug. 29, 2017

(54) HIGH PERFORMANCE COMPOSITE DIELECTRIC INK FOR ULTRACAPACITORS

(71) Applicant: The United States of America as Represented by the Administrator of the National Aeronautics and Space Administration, Washington, DC (US)

(72) Inventors: Terry D. Rolin, Elkmont, AL (US); Curtis W. Hill, Meridianville, AL (US)

(73) Assignee: The United States of America as Represented by the Administrator of NASA, Washington, DC (US)

( * ) Notice: Subject to any disclaimer, the term of this patent is extended or adjusted under 35 U.S.C. 154(b) by 0 days.

(21) Appl. No.: 14/971,595

(22) Filed: Dec. 16, 2015

(65) Prior Publication Data
US 2017/0174915 A1    Jun. 22, 2017

(51) Int. Cl.
*B05D 5/12* (2006.01)
*C09D 11/033* (2014.01)
*C09D 11/14* (2006.01)
*H01G 13/04* (2006.01)
*C08K 3/22* (2006.01)
*C08K 3/40* (2006.01)

(52) U.S. Cl.
CPC .......... *C09D 11/033* (2013.01); *C09D 11/14* (2013.01); *H01G 13/04* (2013.01); *C08K 3/22* (2013.01); *C08K 3/40* (2013.01); *C08K 2003/2206* (2013.01); *C08K 2003/2237* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,089,038 A | * | 5/1978 | Bacher | H05K 1/0306 361/320 |
| 4,426,356 A | * | 1/1984 | Nair | H01G 4/0085 361/305 |
| 4,733,328 A | * | 3/1988 | Blazej | H01G 4/06 29/25.42 |
| 5,137,848 A | * | 8/1992 | Barker | C03C 8/20 501/18 |
| 2008/0280748 A1 | * | 11/2008 | Nishigaki | B82Y 30/00 501/77 |
| 2011/0190432 A1 | * | 8/2011 | Tanabe | C04B 35/62807 524/403 |
| 2012/0167799 A1 | * | 7/2012 | Bae | C08K 5/109 106/217.7 |
| 2013/0094121 A1 | * | 4/2013 | Endo | H01G 4/30 361/305 |

* cited by examiner

*Primary Examiner* — Austin Murata
(74) *Attorney, Agent, or Firm* — James J. McGroary

(57) ABSTRACT

The present invention is a dielectric ink and means for printing using said ink. Approximately 10-20% of the ink is a custom organic vehicle made of a polar solvent and a binder. Approximately 30-70% of the ink is a dielectric powder having an average particle diameter of approximately 10-750 nm. Approximately 5-15% of the ink is a dielectric constant glass. Approximately 10-35% of the ink is an additional amount of solvent. The ink is deposited on a printing substrate to form at least one printed product, which is then dried and cured to remove the solvent and binder, respectively. The printed product then undergoes sintering in an inert gas atmosphere.

20 Claims, 2 Drawing Sheets

HIGH PERFORMANCE COMPOSITE DIELECTRIC INK FOR ULTRACAPACITORS

STATEMENT REGARDING FEDERALLY SPONSORED RESEARCH OR DEVELOPMENT

The invention described herein was made in the performance of work under a NASA contract and by an employee of the United States Government and is subject to the provisions of Public Law 96-517 (35 U.S.C. §202) and may be manufactured and used by or for the Government for governmental purposes without the payment of any royalties thereon or therefore. In accordance with 35 U.S.C. §202, the contractor elected not to retain title.

BACKGROUND OF THE INVENTION

1. Field of Invention

This invention relates to the field of electrical systems and more specifically to a ceramic and glass dielectric ink.

2. Description of Related Art

Space travel requires energy storage systems that can supply power without adding significant weight to a spacecraft. Space missions require both large amounts of power over time and short bursts of energy.

Electrochemical batteries can store amounts of power when charged and provide continuous power over time. However, batteries take considerable time to recharge. Capacitors store electrical energy in a field created between two plates, between which a material called a dielectric is placed to increase the charge storage capability. Capacitors can charge almost instantly and provide a quick release of energy. However, a traditional capacitor stores far less energy than a battery.

Ultracapacitors are highly optimized capacitors which dramatically increase the charge storage capability of traditional capacitors. Ultracapacitors are presently manufactured in a variety of forms and can be recharged in a matter of seconds, compared with the hours required to recharge a standard battery. Ultracapacitors generally may be recharged more than one million times, compared with a few hundred recharges for a battery. They are not susceptible to deterioration when exposed to cold temperatures, and their turnaround efficiencies (the percentage of charge energy that can be recovered) are more than 90 percent, compared with typical battery turnaround efficiencies of 50 percent. In addition, ultracapacitors are made of nonhazardous materials.

The Marshall Space Flight Center has previously developed a highly versatile solid-state ultracapacitor for which a dielectric component can be customized. The dialectic component is made using traditional printing methods.

However, there are several problems known in the art with respect to dielectric ink formulations. Many formulations did not have the correct viscosity for printing processes. Additionally, the inks did not disperse the dielectric particles evenly.

There is an unmet need for a dielectric ink which will consistently disperse dielectric materials to allow precise creation of dielectric components.

BRIEF SUMMARY OF THE INVENTION

One embodiment of the present invention is a dielectric ink composition for use with a solid-state ultracapacitor comprising a custom organic vehicle made of a polar solvent and a binder, a dielectric powder, a dielectric constant glass and an additional amount of the polar solvent. The custom organic vehicle makes up approximately 10% to approximately 20% of the dielectric ink composition. The polar solvent makes up approximately 50% to approximately 80% of the custom organic vehicle, while the binder makes up approximately 20% to approximately 50% of the custom organic vehicle. The dielectric powder makes up approximately 30% to approximately 70% of the dielectric ink composition. The dielectric powder has an average particle diameter ranging from approximately 10 nm to approximately 750 nm. The dielectric constant glass makes up approximately 5% to approximately 15% of the dielectric ink composition. The additional amount of the polar solvent makes up approximately 10% to approximately 35% of the dielectric ink composition.

Another embodiment of the present invention is a method of preparing the above dielectric ink composition. This method includes the steps of: preparing the custom organic vehicle; combining the dielectric powder with the custom vehicle; combining the dielectric constant glass with the dielectric powder and the custom organic vehicle; and combining the additional quantity of the polar solvent with the dielectric constant glass, the dielectric powder and the custom vehicle.

Another embodiment of the present invention is a method of printing with the above dielectric ink composition. First, the method utilizes a means of deposition to deposit the dielectric ink composition on a printing substrate to form at least one printed product. Next, the method dries the printed product to remove the polar solvent from the dielectric ink composition. The method then cures the printed product to remove the binder from the dielectric ink composition. Next, the method sinters the at least one printed product in an inert gas atmosphere.

BRIEF DESCRIPTION OF SEVERAL VIEWS OF THE DRAWING(S)

TERMS OF ART

As used herein, the term "binder" means a material that connects other materials together to form a cohesive whole.

As used herein, the term "dielectric" means an electrical insulator material that can be polarized by an applied electric field.

As used herein, the term "dielectric constant" means the ratio of the permittivity of a material to the permittivity of free space.

As used herein, the term "ink" means a viscous material used for printing.

As used herein, the term "percentage" or "%" means a percentage by weight.

As used herein, the term "polar solvent" means a material with a high dielectric constant that dissolves a solute.

As used herein, the term "powder" means a plurality of particles produced by the grinding, crushing, or disintegration of a solid material, or by the drying of a liquid.

As used herein, the term "solid-state ultracapacitor" means a solid-state capacitor with energy density greater than 1 J/cc.

DETAILED DESCRIPTION OF THE INVENTION

Figure 1:
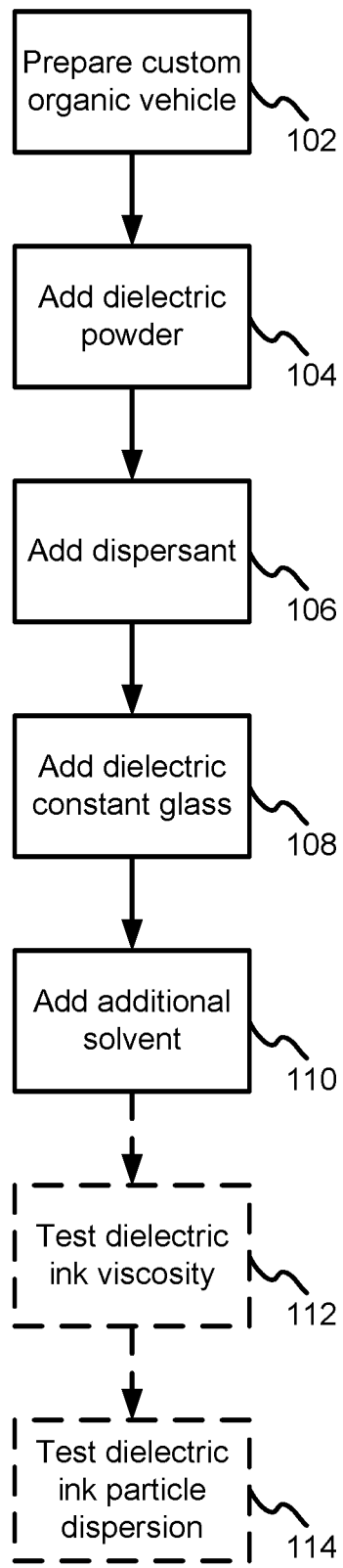
FIG. 1 illustrates an exemplary embodiment of a preparation method for preparing a dielectric ink.

FIG. 1 illustrates an exemplary embodiment of preparation method 100 for preparing dielectric ink. In certain embodiments, the components of the dielectric ink combine using manually mixing, a high shear mixer and/or a three-roll mill.

In step 102, preparation method 100 prepares a custom organic vehicle to serve of the base of the organic ink. The custom organic vehicle is a combination of a polar solvent and a binder material, with viscosity ranging from approximately 30 cP to approximately 15,000 cP. The polar solvent makes up approximately 50% to approximately 80% of the custom organic vehicle, while the binder material makes up approximately 20% to approximately 50% of the custom organic vehicle. In the exemplary embodiment, the solvent may be 2,2,4-trimethyl-1,3-pentandiol monoisobutyrate, terpineol or diethylene glycol monobutyl ether. In the exemplary embodiment, the binder material is ethyl cellulose. The custom organic vehicle makes up approximately 10% to approximately 20% of the dielectric ink.

In step 104, preparation method 100 adds a dielectric powder to the custom vehicle. The dielectric powder has an average particle diameter ranging from approximately 10 nm to approximately 750 nm and a dielectric constant ranging from approximately 5,000 to approximately 1.4 million. In the exemplary embodiment, the dielectric powder is perovskite. In certain embodiments, the particles of dielectric powder have a coating of silica approximately 5 nm to approximately 10 nm thick. In certain embodiments, the dielectric powder has a coating deposited by atomic layer deposition. In certain embodiments, the dielectric powder has been pretreated with a doping process. The dielectric powder makes up approximately 30% to approximately 70% of the dielectric ink. The dielectric ink has a target dielectric powder percentage based on the printing application. For example, aerosol or inkjet deposition requires a lower percentage than screen-printing.

In step 106, preparation method 100 adds a dispersant to the dielectric powder and custom vehicle. In certain embodiments, the dispersant is a surfactant. In the exemplary embodiment, the dispersant is a wetting agent, such as, but not limited to the free-acid form of a tridecyl alcohol ethoxylated phosphate ester. The dispersant makes up approximately 0.5% to approximately 5% of the dielectric ink.

In step 108, preparation method 100 adds a dielectric constant glass to the dielectric powder and custom vehicle. The dielectric constant glass is a powder with a dielectric constant of less than approximately 10. In the exemplary embodiment, the dielectric constant glass is a lead-germanate glass or a zinc borate glass, and does not affect the Curie temperature of the dielectric powder during sintering. The dielectric constant glass makes up approximately 5% to approximately 15% of the dielectric ink.

In step 110, preparation method 100 adds additional solvent to the dielectric constant glass, dielectric powder and custom vehicle form the dielectric ink. In the exemplary embodiment, the additional solvent may be 2,2,4-trimethyl-1,3-pentandiol monoisobutyrate, terpineol or diethylene glycol monobutyl ether. The amount of additional solvent added sets the final viscosity of the dielectric ink, and depends on the printing application. The additional solvent makes up approximately 10% to approximately 35% of the dielectric ink.

In optional step 112, preparation method 100 tests the viscosity of the dielectric ink using a viscometer. The dielectric ink has a target viscosity based on the printing application. For example, aerosol and inkjet deposition require a viscosity of approximately 1 cP to approximately 1,000 cP, a lower viscosity range than screen-printing, which requires a viscosity of approximately 20,000 cP to approximately 100,000 cP, or three-dimensional printing, which requires a viscosity of approximately 10,000 cP to approximately 200,000 cP.

In optional step 114, preparation method 100 tests the particle dispersion of the dielectric ink. The dielectric ink is spread with a stainless steel plate on a fineness of grain gauge. The point that approximately 50% of the pattern is dispersed is the target dispersion point. In the exemplary embodiment, the dielectric ink has a target dispersion point of approximately 5 μm or less.

Figure 2:
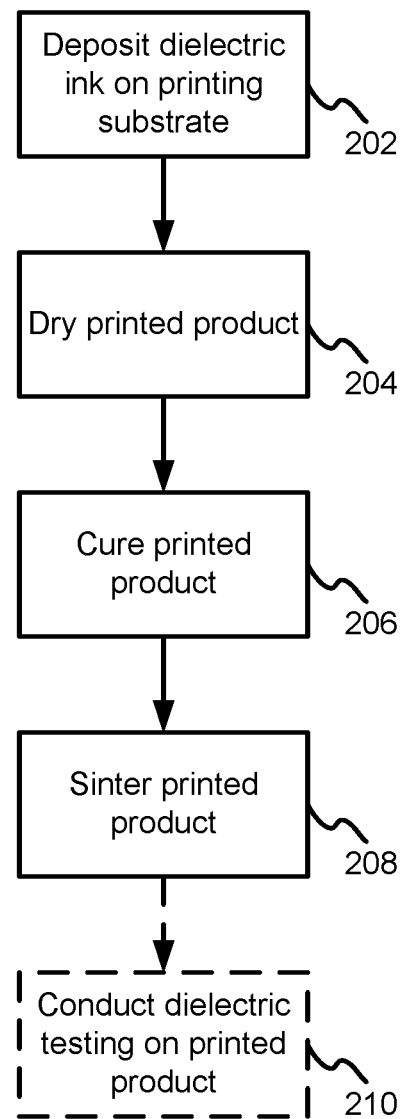
FIG. 2 illustrates an exemplary embodiment of a printing method for printing with a dielectric ink.

FIG. 2 illustrates an exemplary embodiment of printing method 200 for printing with a dielectric ink.

In step 202, printing method 200 deposits a dielectric ink on a printing substrate to form at least one printed product. The means of deposition used may include aerosol deposition, screen-printing or three-dimensional printing. In the exemplary embodiment, the printed product is a solid-state ultracapacitor device. In certain embodiments, the printed product includes parallel conductive electrodes. In certain embodiments, multiple printed products are stacked to form the solid-state ultracapacitor device. These solid-state ultracapacitors can find use in electronics, energy storage, high voltage surge applications, thruster initiators for propulsion and many other applications requiring combinations of ultra-high capacitance and/or high voltage.

In step 204, printing method 200 dries the printed product to remove solvent from the dielectric ink. Drying occurs at a temperature ranging from approximately 100 degrees C. to approximately 150 degrees C. for a period ranging from approximately 10 minutes to approximately 30 minutes.

In step 206, printing method 200 cures the printed product to remove the binder from the dielectric ink. Curing occurs at a temperature ranging from approximately 275 degrees C. to approximately 375 degrees C. for a period of at least 24 hours.

In step 208, printing method 200 sinters the printed product in an inert gas atmosphere. In one embodiment, this step takes place in a nitrogen gas atmosphere. In the exemplary embodiment, this step takes place in a nitrogen gas atmosphere having less than 5 parts per million (PPM) of impurities.

During the sintering step, the printed product heats at a rate ranging from approximately 45 degrees C./minute to approximately 55 degrees C./minute. The printed product is heated at a maximum of 1,200 degrees C. for approximately 10 minutes to approximately 15 minutes. Then the printed product cools at a rate ranging from approximately 45 degrees C./minute to approximately 55 degrees C./minute.

In optional step 210, printing method 200 conducts dielectric testing to characterize the printed product. Properties tested may include capacitance, voltage breakdown, loss (tan δ), electrical series resistance and leakage.

It will be understood that many additional changes in the details, materials, procedures and arrangement of parts, which have been herein described and illustrated to explain the nature of the invention, may be made by those skilled in the art within the principle and scope of the invention as expressed in the appended claims. Moreover, the term "approximately" as used herein may be applied to modify any quantitative representation that could permissibly vary without resulting in a change in the basic function to which it is related.

What is claimed is:

1. A ultracapacitor, comprised of:
   (a) at least one printing substrate for receiving a deposition of dielectric material to form at least one printed structure for an ultracapacitor;
   (b) a high-temperature dielectric ink composition, comprised of a custom organic vehicle comprised of a polar solvent and a binder
      i. wherein said polar solvent comprises approximately 50% to approximately 80% of said custom organic vehicle,
      ii. wherein said binder comprises approximately 20% to approximately 50% of said custom organic vehicle,
      iii. wherein said custom organic vehicle comprises approximately 10% to approximately 20% of said dielectric ink composition;
   (c) a dielectric powder having an average particle diameter ranging from approximately 10 nm to approximately 750 nm, wherein said dielectric powder comprises approximately 30% to approximately 70% of said dielectric ink composition;
   (d) a dielectric constant glass, wherein said dielectric constant glass does not affect the Curie temperature of the dielectric powder during sintering and comprises approximately 5% to approximately 15% of said dielectric ink composition;
   (e) an additional amount of said polar solvent, wherein said additional amount of said polar solvent comprises approximately 10% to approximately 35% of said dielectric ink composition.

2. The composition of claim 1, wherein said polar solvent is selected from the group consisting of: 2,2,4-trimethyl-1,3-pentanediol monoisobutyrate, terpineol and diethylene glycol monobutyl ether.

3. The composition of claim 1, wherein said binder comprises ethyl cellulose.

4. The composition of claim 1, wherein said dielectric powder is perovskite.

5. The composition of claim 1, wherein said dielectric powder is doped.

6. The composition of claim 1, wherein particles of said dielectric powder have a coating of silica approximately 5 nm to approximately 10 nm thick.

7. The composition of claim 1, wherein said dielectric powder has a dielectric constant ranging from approximately 5,000 to approximately 1.4 million.

8. The composition of claim 1, wherein said dielectric constant glass is selected from the group consisting of: lead-germanate glass.

9. The composition of claim 1, wherein said dielectric constant glass has a dielectric constant of up to approximately 10.

10. The composition of claim 1 further comprising a dispersant, wherein said dispersant comprises approximately 0.5% to approximately 5% of said dielectric ink composition.

11. A method of preparing a dielectric ink composition for an ultracapacitor, comprising the steps of:
    (a) preparing a custom organic vehicle by combining approximately 50% to approximately 80% polar solvent and approximately 20% to approximately 50% binder material, wherein said custom organic vehicle comprises approximately 10% to approximately 20% of said dielectric ink composition;
    (b) combining a dielectric powder having an average particle diameter ranging from approximately 50 nm to approximately 750 nm with said custom vehicle, wherein said custom organic vehicle comprises approximately 50% to approximately 70% of said dielectric ink composition;
    (c) combining a dielectric constant glass with said dielectric powder and said custom organic vehicle, wherein said dielectric constant glass comprises approximately 5% to approximately 15% of said dielectric ink and wherein said dielectric constant glass does not affect the Curie temperature of the dielectric powder during sintering composition; and
    (d) combining an additional quantity of said polar solvent with said dielectric constant glass, said dielectric powder and said custom vehicle, wherein said additional quantity of said polar solvent comprises approximately 10% to approximately 35% of said dielectric ink composition.

12. The method of claim 11, further comprising the step of adding a dispersant to said dielectric ink composition until said dispersant comprises up to 5% of said dielectric ink composition.

13. The method of claim 11, wherein said additional quantity of said polar solvent, said dielectric constant glass, said dielectric powder and said custom vehicle are combined using a means selected from the group consisting of: a three-roll mill and a high-shear mixer.

14. A method of printing with a dielectric ink composition, comprising the steps of:
    (a) utilizing a means of deposition to deposit said dielectric ink composition on a printing substrate to form at least one printed product for an ultracapacitor, wherein said dielectric ink composition is comprised of:
       i. a custom organic vehicle comprised of a polar solvent and a binder, wherein said polar solvent comprises approximately 50% to approximately 80% of said custom organic vehicle, wherein said binder comprises approximately 20% to approximately 50% of said custom organic vehicle, wherein said custom organic vehicle comprises approximately 10% to approximately 20% of said dielectric ink composition,
       ii. a dielectric powder having an average particle diameter ranging from approximately 50 nm to approximately 750 nm, wherein said dielectric powder comprises approximately 50% to approximately 70% of said dielectric ink composition,
       iii. a dielectric constant glass, wherein said dielectric constant glass comprises approximately 5% to approximately 15% of said dielectric ink composition wherein said dielectric constant glass does not affect the Curie temperature of the dielectric powder during sintering, and an additional amount of said polar solvent, wherein said additional amount of said polar solvent comprises approximately 10% to approximately 35% of said dielectric ink composition;
    (b) drying said at least one printed product to remove said polar solvent from said dielectric ink composition;
    (c) curing said at least one printed product to remove said binder from said dielectric ink composition; and
    (d) sintering said at least one printed product in an inert gas atmosphere.

15. The method of claim 14, wherein said means of deposition is selected from the group consisting of: aerosol deposition, inkjet deposition, screen-printing and three-dimensional printing.

16. The method of claim 14, wherein said inert gas atmosphere is a nitrogen atmosphere.

17. The method of claim 16, wherein said nitrogen gas atmosphere comprises less than 5 PPM of impurities.

18. The method of claim 14, wherein said step of sintering takes place at a maximum of 1,200 degrees C. for approximately 10 minutes to approximately 15 minutes.

19. The method of claim 14, wherein said step of sintering heats said printed product at a rate ranging from approximately 45 degrees C./minute to approximately 55 degrees C./minute, wherein said step of sintering cools said printed product at a rate ranging from approximately 45 degrees C./minute to approximately 55 degrees C./minute.

20. The method of claim 14, wherein said at least one printed product is a solid-state ultracapacitor.

* * * * *